US008306793B2

(12) United States Patent
Huang et al.

(10) Patent No.: US 8,306,793 B2
(45) Date of Patent: Nov. 6, 2012

(54) SYSTEMS AND METHODS OF PERFORMING VIBRO-ACOUSTIC ANALYSIS OF A STRUCTURE

(75) Inventors: Yun Huang, Livermore, CA (US); Mhamed Souli, Livermore, CA (US); C. Cleveland Ashcraft, Kingston, ID (US)

(73) Assignee: Livermore Software Technology Corporation, Livermore, CA (US)

( * ) Notice: Subject to any disclaimer, the term of this patent is extended or adjusted under 35 U.S.C. 154(b) by 291 days.

(21) Appl. No.: 12/881,467

(22) Filed: Sep. 14, 2010

(65) Prior Publication Data

US 2011/0301929 A1    Dec. 8, 2011

Related U.S. Application Data

(60) Provisional application No. 61/351,516, filed on Jun. 4, 2010.

(51) Int. Cl.
*G06F 17/50* (2006.01)

(52) U.S. Cl. ........ 703/2; 703/5; 703/7; 703/17; 324/309; 702/56; 257/416

(58) Field of Classification Search .................. 703/2, 5, 703/7, 17; 324/309; 702/56; 257/416
See application file for complete search history.

(56) References Cited

U.S. PATENT DOCUMENTS

| | | | | |
|---|---|---|---|---|
| 5,408,881 | A * | 4/1995 | Piche et al. | 73/582 |
| 5,719,945 | A * | 2/1998 | Fuller et al. | 381/71.2 |
| 6,320,113 | B1 * | 11/2001 | Griffin et al. | 84/738 |
| 6,985,836 | B2 | 1/2006 | Cremers et al. | |
| 8,018,010 | B2 * | 9/2011 | Tigli et al. | 257/416 |
| 2003/0009300 | A1 * | 1/2003 | Giurgiutiu | 702/35 |
| 2009/0114789 | A1 * | 5/2009 | Newby | 248/318 |
| 2011/0314914 | A1 * | 12/2011 | Gregg et al. | 73/570.5 |

OTHER PUBLICATIONS

Simulation of Acoustic and Vibro-Acoustic Problems in LS-DYNA using Boundary Element Method, Yun Huang, Mhamed Souli, 10th International LS-DYNA Users Conference, 2008, 8-37-8-44.
A New Look at the High Frequency Boundary Element and Rayleigh Integral Approximations, D.W.Herrin, F. Martinus, T.W. Wu and A.F. Seybert, SAE 2003 Noise & Vibration Conference and Exhibition, 03NVC-114.
Boundary Element Acoustics: Fundamentals and Computer Codes, T.W. Wu (Editor), WIT Press, ISBN: 1-85312-570-9 Chapter 2 pp. 9-23, "The Helmholtz integral equation", T. W. Wu, Dept. of Mechanical Engineering, University of Kentucky, KY 40506.

(Continued)

*Primary Examiner* — Thai Phan
(74) *Attorney, Agent, or Firm* — Roger H. Chu

(57) ABSTRACT

Methods and systems for simulating acoustic field resulted from particular excitations by performing vibro-acoustic analysis of a structure are disclosed. According to one aspect of the present invention, vibro-acoustic analysis of a structure is performed in two stages. First, steady state dynamic (SSD) responses are obtained using a finite element analysis model of a structure subject to harmonic excitations (e.g., external nodal loads, pressures, or enforced motions (e.g., ground motions), etc.). The steady state responses are the results (e.g., nodal velocities at desired locations of the structure) obtained in a finite element analysis in frequency-domain. Second, an acoustic analysis is conducted according to Helmholtz equation using the nodal velocities obtained at desired locations on the structure as a boundary condition. The acoustic analysis can be performed in a number of procedures (e.g., boundary element method, Rayleigh approximation method, etc.).

12 Claims, 6 Drawing Sheets

OTHER PUBLICATIONS

Boundary Element Acoustics: Fundamentals and Computer Codes, T.W. Wu (Editor), WIT Press, ISBN: 1-85312-570-9 Chapter 4 pp. 51-67, "Three-dimensional problems", T.W. Wu, Dept of Mechanical Engineering, University of Kentucky, Lexington KY 40506.

Boundary Element Acoustics: Fundamentals and Computer Codes, T.W. Wu (Editor), WIT Press, ISBN: 1-85312-570-9 Chapter 6 pp. 83-98, "Indirect variational boundary element method in acoustics", N. Vlahopoulos, Dept. of Naval Architecture and Marine Engineering, University of Michigan.

* cited by examiner

SYSTEMS AND METHODS OF PERFORMING VIBRO-ACOUSTIC ANALYSIS OF A STRUCTURE

CROSS REFERENCE TO RELATED APPLICATIONS

This application claims priority from U.S. Provisional Patent Application Ser. No. 61/351,516 for the same title, filed on Jun. 4, 2010, the entire content of which is incorporated herein by reference.

BACKGROUND OF THE INVENTION

1. Field of the Invention

The present invention generally relates to computer-aided engineering analysis of a structure, more particularly to systems and methods of performing vibro-acoustic analysis of a structure subjected to harmonic excitations (i.e., loads).

2. Description of the Related Art

The finite element method (FEM) (sometimes referred to as finite element analysis (FEA)) is a numerical technique for finding approximate solutions of partial differential equations (PDE) as well as of integral equations. The solution approach is based either on eliminating the differential equation completely (steady state problems), or rendering the PDE into an approximating system of ordinary differential equations, which are then numerically integrated using standard techniques such as Euler's method, Runge-Kutta, etc.

FEA is becoming increasingly popular with automobile manufacturers for optimizing both the aerodynamic performance and structural integrity of vehicles. Similarly, aircraft manufacturers rely upon FEA to predict airplane performance long before the first prototype is built. Rational design of semiconductor electronic devices is possible with Finite Element Analysis of the electrodynamics, diffusion, and thermodynamics involved in this situation. FEA is utilized to characterize ocean currents and distribution of contaminants. FEA is being applied increasingly to analysis of the production and performance of such consumer goods as ovens, blenders, lighting facilities and many plastic products. In fact, FEA has been employed in as many diverse fields as can be brought to mind, including plastics mold design, modeling of nuclear reactors, analysis of the spot welding process, microwave antenna design, simulating of car crash and biomedical applications such as the design of prosthetic limbs. In short, FEA is utilized to expedite design, maximize productivity and efficiency, and optimize product performance in virtually every stratum of light and heavy industry. This often occurs long before the first prototype is ever developed.

One of the challenging FEA tasks is to simulate acoustic responses (e.g., noises) of a structure subjected to external excitations. The common approaches for solving a structural acoustic response problem involve solving equations in vibration and acoustic analyses. For systems with large number of FEA elements, solving these equations in traditional numerical methods becomes computational intensive and requires large resources.

Over the past decades, boundary element method (BEM) has emerged as a versatile and powerful tool for solving engineering problems. BEM is a numerical method for solving boundary-value or initial-value problems formulated by using boundary integral equations. BEM is advantageous for solving infinite domain problems since the radiation condition at infinity is automatically satisfied. BEM reduces the dimension of the problems by one, e.g. only boundaries of the domain need to be meshed. Thus BEM is presented in many cases as an alternative to the more widely used FEA. Particularly BEM has become a good candidate for solving acoustic problems which are governed by Helmholtz equation.

Many of the prior art approaches to perform vibro-acoustic analysis have been ad hoc, for example, stringing together different computer software. These approaches not only require human intervention, but also are error prone. Therefore, it would be desirable to have integrated methods and systems for performing vibro-acoustic analysis of a structure effectively and efficiently, using both FEA and BEM.

SUMMARY OF THE INVENTION

This section is for the purpose of summarizing some aspects of the present invention and to briefly introduce some preferred embodiments. Simplifications or omissions in this section as well as in the abstract and the title herein may be made to avoid obscuring the purpose of the section. Such simplifications or omissions are not intended to limit the scope of the present invention.

Methods and systems for simulating acoustic field resulted from particular excitations by performing vibro-acoustic analysis of a structure are disclosed. According to one aspect of the present invention, vibro-acoustic analysis of a structure is performed in two stages. First, steady state dynamic (SSD) responses are obtained using a finite element analysis model of a structure subject to harmonic excitations (e.g., external nodal loads, pressures, or enforced motions (e.g., ground motions), etc.). The steady state responses are the results (e.g., nodal velocities at desired locations of the structure) obtained in a finite element analysis in frequency-domain. Second, an acoustic analysis is conducted according to Helmholtz equation using the nodal velocities obtained at desired locations on the structure as a boundary condition. The acoustic analysis can be performed in a number of procedures (e.g., boundary element method, Rayleigh approximation method, etc.).

According to another aspect, a modal analysis of the structure is performed first to extract natural vibration frequencies (i.e., eigen-frequencies) and corresponding vibration modes of the structure. Harmonic excitations are then applied using a mode-superposition technique to obtain SSD responses (e.g., nodal velocities or pressures) at certain desired locations on the structure, for example, wind shield and interior panels of an automobile for determining noise level as result of the excitations. The external excitations are generally represented by an amplitude and a phase angle of periodical loads (e.g., sinusoidal excitations) in forms of spectrum for a range of frequencies. Characteristics of the structure are represented by frequency response function (FRF), where the structural responses (measured or computed) are resulted from a unit harmonic input excitation.

Alternatively, a finite element transient analysis can be conducted. The time-domain solution (nodal velocity) is then converted to frequency-domain via Fourier transform.

In some instances, intermittent modal analysis is performed, for example, for a pre-stressed condition of the structure or any nonlinearity existed in the structure. The intermittent eigen-frequencies and corresponding vibration modes of the structure are then adopted to obtain SSD responses.

According to yet another aspect, the SSD responses and FRF are adjusted with various techniques of applying damping with various techniques, such that the numerical simulations can better match the real world results.

Once the SSD responses are obtained (e.g., nodal velocities at desired locations on the structure), resulting acoustics can be calculated using another computer aided analysis technique (e.g., boundary element method (BEM) or other equivalent methods (e.g., Rayleigh method)). In BEM, the pressure at any point in the acoustic domain is obtained from an integral equation of pressure and velocity over surfaces of interest (e.g., windshield of a car). Rayleigh's method is based on the hypothesis that each element of the vibrating surface is mounted on an infinite rigid baffle and vibrates independently from each other. The total pressure field is determined from summing the pressure generated by each element. One exemplary usage of the methods and systems described herein is referred to as NVH (noise, vibration and harshness) analysis of an automobile. Calculations of acoustic field responses at certain desired locations are conducted at a set of distinct frequencies without interpolation.

According to still another aspect, acoustic responses are obtained using a parallel computing technique referred to as domain decomposition. And low rank approximations of matrices have been implemented for speedy solution. A GMRES (Generalized Minimal RESidual method) iterative solver with various pre-conditioners is adopted for faster convergence.

Other objects, features, and advantages of the present invention will become apparent upon examining the following detailed description of an embodiment thereof, taken in conjunction with the attached drawings.

BRIEF DESCRIPTION OF THE DRAWINGS

These and other features, aspects, and advantages of the present invention will be better understood with regard to the following description, appended claims, and accompanying drawings as follows:

DETAILED DESCRIPTIONS OF THE INVENTION

Figure 1:
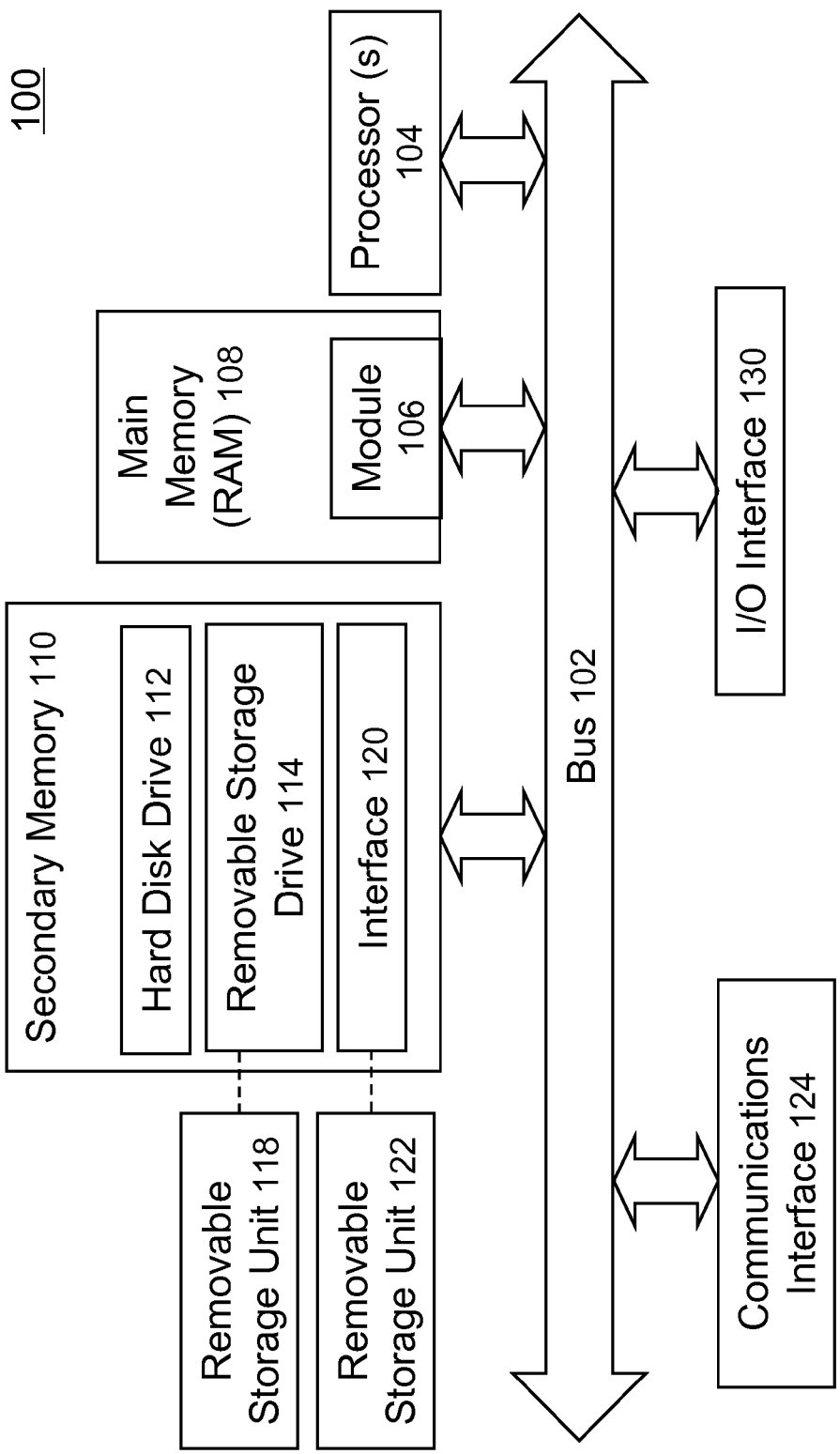
FIG. 1 is a block diagram showing an exemplary computer, in which one embodiment of the present invention may be implemented.

In the following description, numerous specific details are set forth in order to provide a thorough understanding of the present invention. However, it will become obvious to those skilled in the art that the present invention may be practiced without these specific details. The descriptions and representations herein are the common means used by those experienced or skilled in the art to most effectively convey the substance of their work to others skilled in the art. In other instances, well-known methods, procedures, components, and circuitry have not been described in detail to avoid unnecessarily obscuring aspects of the present invention.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments mutually exclusive of other embodiments. Further, the order of blocks in process flowcharts or diagrams representing one or more embodiments of the invention do not inherently indicate any particular order nor imply any limitations in the invention.

Embodiments of the present invention are discussed herein with reference to FIGS. 1-5. However, those skilled in the art will readily appreciate that the detailed description given herein with respect to these figures is for explanatory purposes as the invention extends beyond these limited embodiments.

Referring now to the drawings, in which like numerals refer to like parts throughout several views. The present invention may be implemented using hardware, software or a combination thereof and may be implemented in a computer system or other processing system. In fact, in one embodiment, the invention is directed towards one or more computer systems capable of carrying out the functionality described herein. An example of a computer system 100 is shown in FIG. 1A. The computer system 100 includes one or more processors, such as processor 122. The processor 122 is connected to a computer system internal communication bus 120. Various software embodiments are described in terms of this exemplary computer system. After reading this description, it will become apparent to a person skilled in the relevant art(s) how to implement the invention using other computer systems and/or computer architectures.

Computer system 100 also includes a main memory 108, preferably random access memory (RAM), and may also include a secondary memory 110. The secondary memory 110 may include, for example, one or more hard disk drives 112 and/or one or more removable storage drives 114, representing a floppy disk drive, a magnetic tape drive, an optical disk drive, etc. The removable storage drive 114 reads from and/or writes to a removable storage unit 118 in a well-known manner. Removable storage unit 118, represents a flash memory, floppy disk, magnetic tape, optical disk, etc. which is read by and written to by removable storage drive 114. As will be appreciated, the removable storage unit 118 includes a computer usable storage medium having stored therein computer software and/or data.

In alternative embodiments, secondary memory 110 may include other similar means for allowing computer programs or other instructions to be loaded into computer system 100. Such means may include, for example, a removable storage unit 122 and an interface 120. Examples of such may include a program cartridge and cartridge interface (such as that found in video game devices), a removable memory chip (such as Erasable Programmable Read-Only Memory (EPROM), Universal Serial Bus (USB) flash memory, or PROM) and associated socket, and other removable storage units 122 and interfaces 120 which allow software and data to be transferred from the removable storage unit 122 to computer system 100. In general, Computer system 100 is controlled and coordinated by operating system (OS) software, which performs tasks such as process scheduling, memory management, networking and I/O services.

There may also be a communications interface 124 connecting to the bus 102. Communications interface 124 allows software and data to be transferred between computer system 100 and external devices. Examples of communications interface 124 may include a modem, a network interface (such as an Ethernet card), a communications port, a PCMCIA slot and card, etc.

The computer 100 communicates with other computing devices over a data network based on a special set of rules (i.e., a protocol) to send data back and forth. One of the common protocols is TCP/IP (Transmission Control Protocol/Internet Protocol) commonly used in the Internet. In general, the communication interface 124 manages the assembling of a data file into smaller packets that are transmitted over the data network or reassembles received packets into the original data file. In addition, the communication interface 124 handles the address part of each packet so that it gets to the right destination or intercepts packets destined for the computer 100.

In this document, the terms "computer recordable storage medium", "computer recordable medium" and "computer readable medium" are used to generally refer to media such as removable storage drive 114, and/or a hard disk installed in hard disk drive 112. These computer program products are means for providing software to computer system 100. The invention is directed to such computer program products.

The computer system 100 may also include an I/O interface 130, which provides the computer system 100 to access monitor, keyboard, mouse, printer, scanner, plotter, and alike.

Computer programs (also called computer control logic) are stored as application modules 106 in main memory 108 and/or secondary memory 110. Computer programs may also be received via communications interface 124. Such computer programs, when executed, enable the computer system 100 to perform the features of the present invention as discussed herein. In particular, the computer programs, when executed, enable the processor 104 to perform features of the present invention. Accordingly, such computer programs represent controllers of the computer system 100.

In an embodiment where the invention is implemented using software, the software may be stored in a computer program product and loaded into computer system 100 using removable storage drives 114, hard drive 112, or communications interface 124. The application module 106, when executed by the processor 104, causes the processor 104 to perform the functions of the invention as described herein.

The main memory 108 may be loaded with one or more application modules 106 that can be executed by one or more processors 104 with or without a user input through the I/O interface 130 to achieve desired tasks. In operation, when at least one processor 104 executes one of the application modules 106, the results (e.g., acoustic pressure in terms of noise level in a vehicle) are computed and stored in the secondary memory 110 (i.e., hard disk drive 112). For example, the SSD and acoustic analysis results can be saved to memory and reported to the user via the I/O interface 130 either as a list or a graph.

Figure 2:
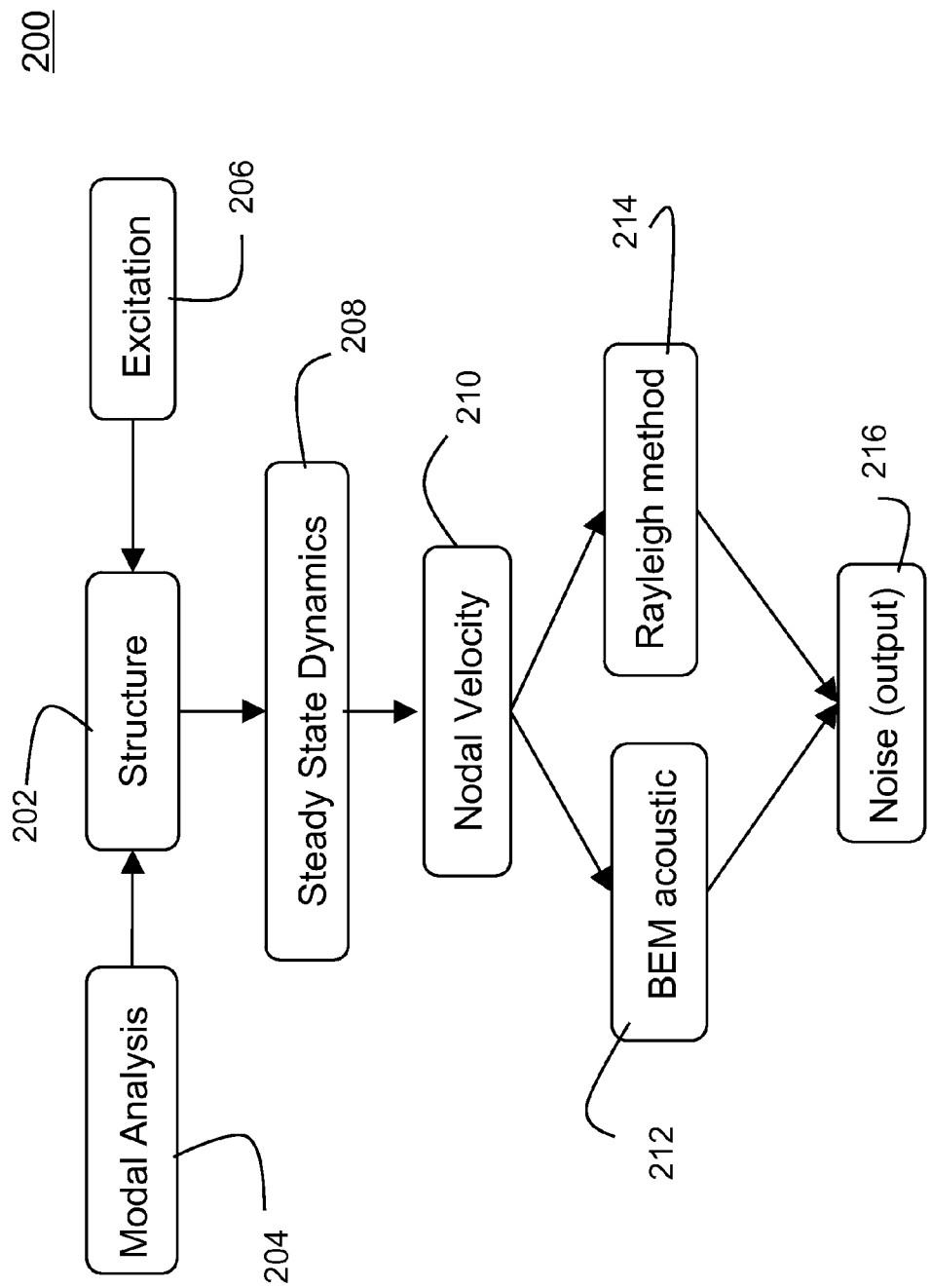
FIG. 2 is a block diagram showing the process of solving a vibro-acoustic problem for a structure subjected to an excitation according to one embodiment of the present invention.

Referring now to FIG. 2, it is shown a diagram 200 depicting relationship of various functions of performing vibro-acoustic analysis of a structure in accordance with one embodiment of the present invention. In diagram 200, a structure 202 (e.g., a car) is simulated using a computer aided analysis software (e.g., finite element method (FEM), boundary element method (BEM), etc.). The structure 202 is generally represented by a FEM model that includes a plurality of nodes and elements. Stiffness and mass of the structure can be calculated from the FEA model in forms of stiffness and mass matrices. Mass may be represented by a lumped mass scheme, which results in only diagonal terms in the mass matrix. Having mass and stiffness matrices defined, a modal analysis 204 can be performed. Natural vibration frequencies and respective vibration modes are obtained. Mathematically, this procedure is referred to as an eigensolution. Each natural vibration mode is orthogonal to another.

Steady state dynamic responses 208 of the structure are calculated with an excitation input 206. The excitation input 206 is in forms of harmonic external loads such as vibration or force generated from environment (e.g., airflow surrounding the car, tire contacting the ground, etc.). The procedure to calculate steady state dynamic responses is referred to as mode-superposition. Generally, the steady state dynamic responses are the superposition of the various modal contributions. In practice, depending upon the loading (i.e., excitation), most of the contributions are from lowest frequency modes.

To obtain SSD, a mode-superposition technique is used. The equation of motions including damping effect is as follows:

$$m\ddot{u}+c\dot{u}+ku=p(t) \quad (1)$$

where m, c and k are the mass, damping and stiffness matrices. p(t) is the external force. Using the mode superposition method, the displacement response can be expressed by $$u = \sum_{n=1}^{N} \phi_n q_n(t) = \Phi q \quad (2)$$

where $\phi_n$ is the n-th mode shape and $q_n(t)$ is the n-th modal coordinates.

With the substitution of Equation (2) into Equation (1), the governing equation can be rewritten as $$m\Phi\ddot{q}+c\Phi\dot{q}+k\Phi q=p(t) \quad (3)$$

Pre-multiplying Equation (3) by $\Phi^T$ gives $$M\ddot{q}+C\dot{q}+Kq=P(t) \quad (4)$$

The orthogonality of natural modes implies that the following square matrices are diagonal:

$$M=\Phi^T m\Phi K\equiv\Phi^T k\Phi \quad (5)$$

where the diagonal terms are expressed as follows:

$$M_n=\phi_n^T m\phi_n K_n=\phi_n^T k\phi_n \quad (6)$$

Since m and k are positive definite, the diagonal elements of M and K are positive. They are related by $$K_n=\omega_n^2 M_n \quad (7)$$

The square matrix C is obtained similarly as follows:

$$C\equiv\Phi^T c\Phi \quad (8)$$

where C may or may not be diagonal, depending on the distribution of damping in the system. If C is diagonal (the diagonal terms are $C_n=\phi_n^T c\phi_n$), Equation (4) represents N uncoupled differential equations in modal coordinates $q_n$, and the system is said to have classical damping and the systems possess the same natural modes as those of the undamped system. Only the classical damping is considered in this approach. The right hand side vector (generalized force) P(t) is $$P(t)=\Phi^T p(t) \quad (9)$$

For an N-DOF system with classical damping, each of the N differential equations in modal coordinates is $$M_n \ddot{q}_n + C_n \dot{q}_n + K_n q_n = P_n(t) \tag{10}$$

or $$\ddot{q}_n + 2\zeta_n \omega_n \dot{q}_n + \omega_n^2 q_n = \frac{P_n(t)}{M_n} \tag{11}$$

where the modal damping coefficient $\zeta_n$ is defined as $$\zeta_n = \frac{C_n}{2 M_n \omega_n} \tag{12}$$

Applying Fourier transform to both sides of Equation (11), one obtains $$(-\omega^2 + 2i\zeta_n \omega_n \omega + \omega_n^2) q_n(\omega) = \frac{P_n(\omega)}{M_n} \tag{13}$$

The structural displacement response in frequency-domain can be represented as $$u(\omega) = \sum_{n=1}^{N} \frac{\phi_n}{(-\omega^2 + 2i\zeta_n \omega_n \omega + \omega_n^2)} \frac{P_n(\omega)}{M_n} \tag{14}$$

The structural velocity response in frequency domain can be represented as $$v(\omega) = i\omega \sum_{n=1}^{N} \frac{\phi_n}{(-\omega^2 + 2i\zeta_n \omega_n \omega + \omega_n^2)} \frac{P_n(\omega)}{M_n} \tag{15}$$

As illustrated by Equations (14) and (15), system damping has important effect SSD. Damping can be prescribed in a few ways, such as constant modal damping ratios, mode-dependent damping ratios or Rayleigh damping, i.e. the damping matrix proportional to the mass and stiffness matrices. Damping affects not only the amplitude, but also the phase angle of the frequency response.

The procedure described above is directly applicable when the excitations or loads are given in the form of nodal force or pressure. When the loads are given as enforced motion, the large mass method can be used to convert the load to nodal forces. To use the large mass method, a huge mass $m_0$ is attached to the nodes where the enforced motion is prescribed. The attached mass is usually several orders of magnitude larger than the mass of the original entire structure. Then a huge nodal force p is applied to the nodes at the degree-of-freedom of excitation to generate the desired acceleration.

$$\ddot{u} = \frac{p}{m_0} \tag{16}$$

Figure 3A:
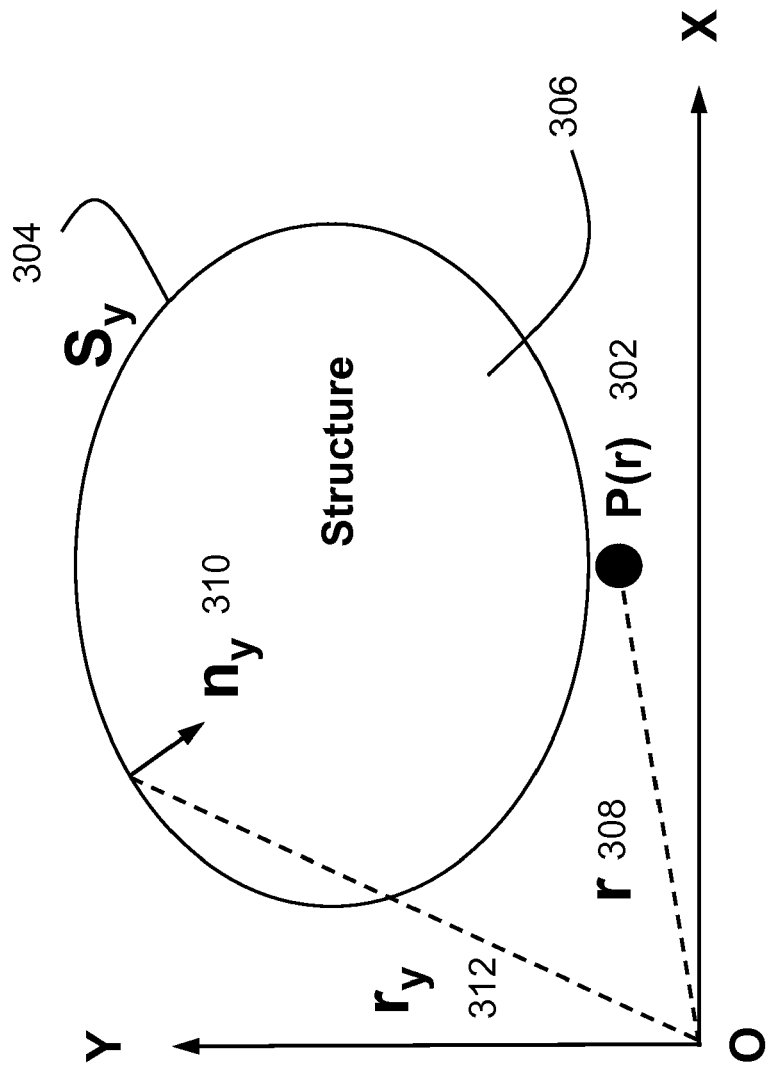
FIGS. 3A-B are diagrams showing exemplary acoustic domains related to a structure.
Figure 3B:
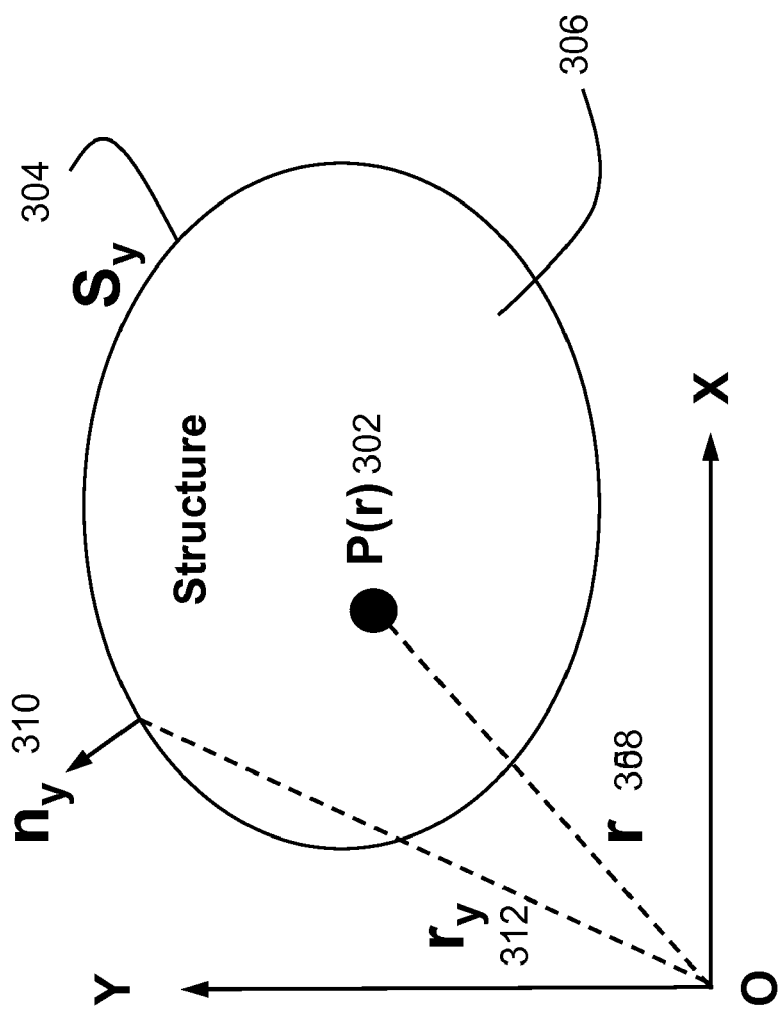

According to one embodiment, after velocity response 210 is obtained at certain desired nodes, acoustic pressure at a point of interest can be calculated using boundary element method 212 or other equivalent methods (e.g., Rayleigh method) 214, for example, acoustic radiation of the exterior of a structure 306 shown in FIG. 3A or the interior shown in FIG. 3B. Acoustic pressure p 302 at any point in the acoustic domain is calculated. An acoustic domain boundary 304 denoted as $S_y$ is shown on the border of the structure 306. In frequency domain, the acoustic wave propagation in an ideal fluid in absence of any volume acoustic source is governed by Helmholtz equation given as follows:

$$\Delta p + k^2 p = 0 \tag{17}$$

where $k = \omega/c_S$ denotes the wave number, $c_S$ is the sound velocity in the acoustic domain, $\omega = 2\pi f$ is the circular frequency, p(r) 302 is the pressure at any field point.

Equation (17) can be transformed into an integral equation form by using Green's Theorem. In this case, the pressure p 302 at any point in the acoustic domain (e.g., air) can be expressed as an integral equation of both pressure and velocity, over a surface as given by the following equation:

$$\overline{C}(r) p(r) = \int_{S_y} \left( G(r, r_y) \frac{\partial p(r)}{\partial n_y} - p \frac{\partial G(r, r_y)}{\partial n_y} \right) dS_y \tag{18}$$

where $$G(r, r_y) = \frac{e^{-ik|r-r_y|}}{4\pi |r - r_y|}$$

is the Green's function, r 308 is the vector defining the location of the point of interest for acoustic pressure, while $r_y$ 312 is the vector defining a point on the surface $S_y$, $n_y$ is the normal on the surface $S_y$ 304 and $\overline{C}(r)$ is the jump term resulting from the treatment of the singular integral involving Green's function. The normal derivative of the pressure is related to the normal velocity by $$\frac{\partial p}{\partial n_y} = -i\omega \rho v_n,$$

where $\rho$ is the density of the acoustic fluid and i $(=\sqrt{-1})$ is the imaginary unit.

The knowledge of pressure and velocity on the surface allows to calculate the pressure of any field point. This constitutes the main idea of the integral equation theory. In practical cases, the problems are either Neumann, Dirichlet or Robin ones depending on different boundary conditions. In Neumann problem, the velocity is prescribed on the boundary while in Dirichlet case the pressure is imposed on the boundary. Finally, for Robin problems the acoustic impedance, which is a combination of velocity and pressure, is given on the boundary. Hence, only half of the variables are known on the surface domain. For the vibro-acoustic problem discussed here, the Neumann problem is applicable. The boundary velocity is obtained from SSD (Steady State Dynamics) of the structure for given harmonic excitation.

According to one embodiment, to deduce the other acoustic variables on the surface, BEM (boundary element method) can be used to discretize the integral equation. Several BEM can be used. The simplest one is called collocation method. In this technique, the integral equation is written for each node of the boundary. Assembling the produced elementary vectors yields a linear system for which the solution allows to deduce the other half of the acoustic variables. Although this method uses simple integrals, it involves non symmetric complex and fully populated system.

According to another embodiment in variational BEM, the equation is multiplied by a test function and integrated over the surface. As for the FEM, the variational BEM provides a symmetric linear system. However, it is still complex and fully populated. Another feature compared to the collocation is that the variational approach involves double integrals. It is to be emphasized that in BEM the linear system depends on the frequency via the Green's function. The whole equation system has to be assembled and solved for each frequency. An iterative solver based on generalized minimal residual (GMRES) method is more efficient than direct solver.

In an alternative embodiment, the acoustic pressure can be calculated using a method referred to as Rayleigh method. The method is based on the hypothesis that each element of the vibrating surface is mounted on an infinite rigid baffle and vibrates independently from the other elements constituting the vibrating surface. Consequently, the total pressure field is obtained by summing the pressure generated by each element. The corresponding Green's function is constructed using the method of mirror images.

Figures 4A, 4B:
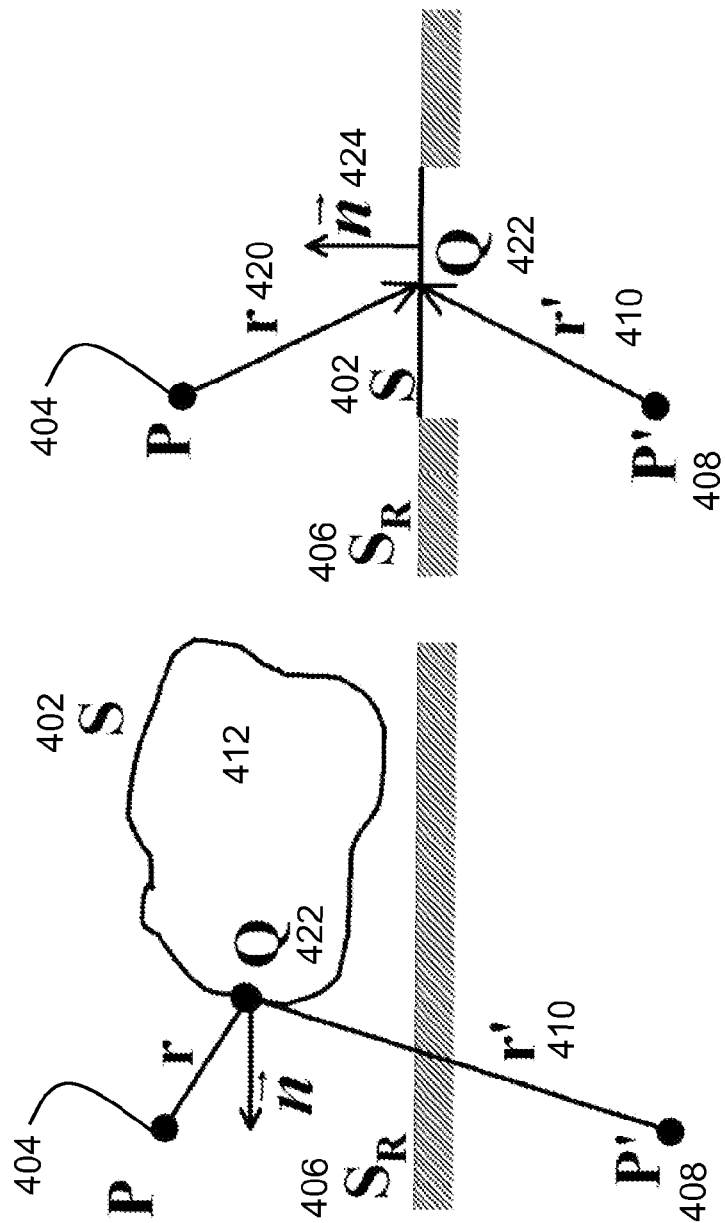
FIG. 4A is a diagram showing a definition of an exemplary half space acoustic radiation problem according to one embodiment of the present invention.
FIG. 4B is a diagram showing a special case with the vibrating surface falls on the reflecting surface according to another embodiment of the present invention.

Referring now to FIGS. 4A-B, there are diagrams showing definitions of acoustic radiation pressure calculated using Rayleigh's method. The mirror image of point P 404 with respect to the reflecting surface $S_R$ 406 is noted P' 408 and r' 410 is the distant between P' 408 and any point Q∈S∪$S_R$. r 420 is the distance between P 404 and Q 422, which is a point located on S or $S_R$. S 402 is the acoustic boundary shown as the border of the structure 412 in FIG. 4A and as a projected surface of the structure 412 in FIG. 4B. The normal vector at point Q 422 is noted as n 424. The Green's function of an infinite domain is given by adding the image solution to the fundamental solution G(r). Consequently, the half space Green's function is written as:

$$G_R(r, r') = \frac{e^{-ikr}}{4\pi r} + \frac{e^{-ikr'}}{4\pi r'} \quad (19)$$

When the vibrating surface falls somewhere on the reflecting surface $S_R$ 406, then r=r' and $$\frac{\partial r}{\partial n} = -\frac{\partial r'}{\partial n}$$

and consequently, the Green's function and its derivatives become:

$$G_R(r, r') = 2G(r) = 2\frac{e^{-ikr}}{4\pi r}, \frac{\partial G_R(r, r')}{\partial n} = 0 \quad (20)$$

By considering this new Green's function into Equation (18), we can write the Rayleigh integral as following:

$$p(r) = -2\int i\rho_f \omega V_n G(r) dS \quad (21)$$

where G(r) is the Green's function in free field.

Since the normal velocity has been obtained in Equation (15) on the surface by SSD (Steady State Dynamics), the pressure at point P 404 is calculated by simple summation. Hence, unlike the BEM, the Rayleigh method does not require to solve a linear system of equations.

For high frequencies, the pressure at the surface can be approximated without solving the integral equation only by using the velocity on the surface. At these frequencies, the radiation impedance is approximately equal to that of the medium. In this case, p=ρcv at the surface. By replacing this relationship in Equation (18):

$$p(r) = -2\int i\rho_f \omega V_n G(r)\left(1 - \frac{\partial r}{\partial n}\left(1 + \frac{1}{ikr}\right)\right) dS \quad (22)$$

When the normal velocity $V_n$ is known, this integral (i.e., Equation (22)) can be evaluated numerically without solving a linear system.

In order to analyze acoustic panel contribution, the boundary is divided into several panels, each representing a contributing component of a structure (e.g., the front wind shield, the side windows of a car for predicting noise level in the vehicle). The surface integral in Equation (18) can be calculated on each of the panels and then summed up as in the following form.

$$\overline{C}(r)p(r) = \sum_{j=1}^{N}\int_{S_{yj}}\left(G(r, r_y)\frac{\partial p(r)}{\partial n_y} - p\frac{\partial G(r, r_y)}{\partial n_y}\right)dS_{yj} \quad (23)$$
$$= \sum_{j=1}^{N} p_j(r)$$

where, $S_{yj}$ represents the area of the j-th panel. The panel contribution percentage $c_j$ for the j-th panel is the ratio of the pressure vector contributed by the j-th panel on the total pressure vector p, and it is expressed as:

$$c_j = 100 \times \frac{p_j \cdot p}{p \cdot p} \quad (24)$$

where, "●" represents the inner production of two vectors. So $c_j$ is the ratio of the length of the projected contribution pressure vector (in the direction of the total pressure vector) to the length of the total pressure vector.

According to one aspect, the velocity obtained in steady state dynamics is in a range of frequencies. In order to calculate acoustic pressure at any point of interest, all frequencies of interest need to be considered, for example, every Hertz (Hz) between 1 to 1000 Hz.

Figure 5:
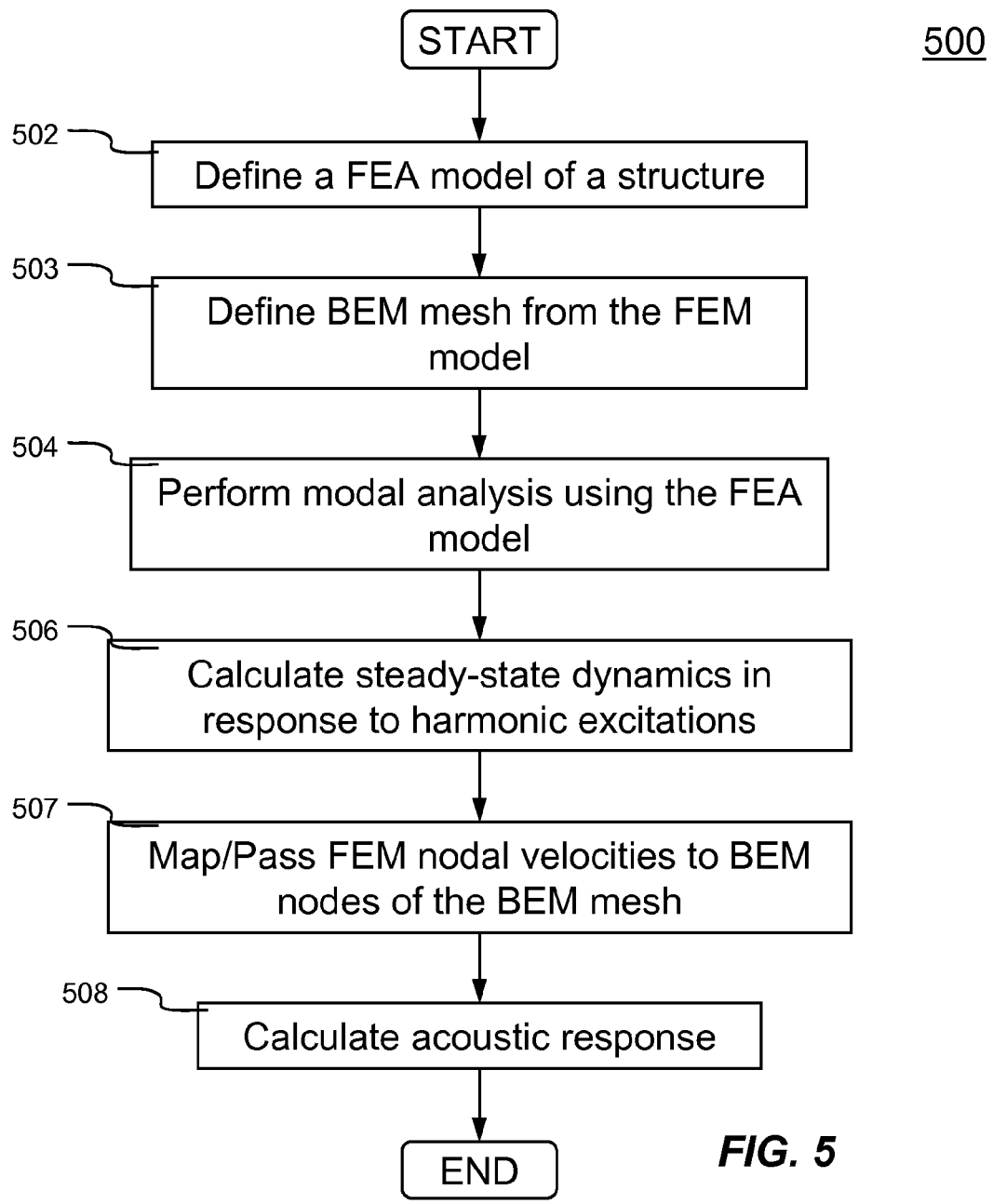
FIG. 5 is a flowchart illustrating an exemplary process of performing a vibro-acoustic simulation for a structure using a combined technique of finite element and boundary element (or Rayleigh) analysis, according to one embodiment of the present invention.

Referring now to FIG. 5, it is a flowchart illustrating an exemplary process of performing a vibro-acoustic simulation for a structure using a combined technique of finite element and boundary element (or Rayleigh) analysis, according to one embodiment of the present invention. Process 500 is preferably implemented in software.

Process 500 starts by defining a FEA model of a structure of interest at step 502. Next at step 503, a corresponding BEM mesh is created based on the FEM model. The BEM mesh is defined as a part of or the whole surface of the FEM model. Then at step 504, a modal analysis is performed using the FEA model. Natural vibration frequencies and corresponding mode shapes of the structure are obtained. Using mode-superposition procedure, steady state dynamic responses can be obtained for harmonic excitations at step 506. For vibro-acoustic analysis, velocity spectrum at certain desired nodes is calculated. As a result, an amplitude and a phase angle of the nodal velocity are obtained at each frequency of interest.

After the desired nodal velocity has been obtained, it is mapped/passed to the BEM nodes of the corresponding BEM mesh at step 507. Acoustic response is calculated at any point of interest at step 508 based on BEM or Rayleigh method. For example, a car's wind shield, side windows are treated as panels. Noise level inside the vehicle is calculated thereafter, for example, using Equations (18) or (21). Process 500 ends.

Although the present invention has been described with reference to specific embodiments thereof, these embodiments are merely illustrative, and not restrictive of, the present invention. Various modifications or changes to the specifically disclosed exemplary embodiments will be suggested to persons skilled in the art. For example, whereas, for illustration simplicity, FIGS. 3A-B and 4A-B are shown in two-dimension, the present invention is generally used in three-dimension. In summary, the scope of the invention should not be restricted to the specific exemplary embodiments disclosed herein, and all modifications that are readily suggested to those of ordinary skill in the art should be included within the spirit and purview of this application and scope of the appended claims.

We claim:

1. A method executed in a computer system of performing vibro-acoustic simulation of a structure in response to harmonic excitations, the method comprising:
    defining, in a computer system, a finite element analysis (FEA) model of a structure to represent the structure's mass, damping and stiffness characteristics;
    obtaining a set of steady-state dynamic (SSD) responses in form of velocity spectrum at a set of nodes of interest of the FEA model using a mode-superposition technique in response to a set of harmonic excitations in a range of frequencies; and
    calculating acoustic field responses at certain desired locations using an acoustic numerical procedure with nodal velocities from the velocity spectrum as boundary conditions, wherein the set of nodes directly affects the acoustic field responses for assisting user to improve the structure's design.

2. The method of claim 1, said obtaining a set of steady-state dynamic responses further includes conducting a modal analysis of the structure using the mass and the stiffness to extract a set of natural vibration frequencies and corresponding vibration modes.

3. The method of claim 2, where the modal analysis is replaced by an intermittent modal analysis when the structure has a nonlinear behavior.

4. The method of claim 3, wherein the nonlinear behavior includes a pre-stressed condition.

5. The method of claim 2, wherein the set of natural vibration frequencies includes lowest modes significantly affecting the steady-state dynamic response.

6. The method of claim 2, wherein said mode-superposition technique is achieved by summing up contributions from all of the set of vibration models including effects from the damping.

7. The method of claim 1, wherein each of the nodal velocities comprises an amplitude and a phase angle.

8. The method of claim 1, wherein the acoustic numerical procedure is based on Helmholtz equation and boundary element method (BEM).

9. The method of claim 1, wherein the acoustic numerical procedure is based on Rayleigh's method.

10. The method of claim 1, wherein said calculating acoustic field responses at certain desired locations is conducted at a set of distinct frequencies without interpolation.

11. A non-transitory machine-readable storage medium containing instructions for controlling a computer system for performing vibro-acoustic simulation of a structure in response to harmonic excitations by a method comprising:
    defining, in a computer system, a finite element analysis (FEA) model of a structure to represent the structure's mass, damping and stiffness characteristics;
    obtaining a set of steady-state dynamic (SSD) responses in form of velocity spectrum at a set of nodes of interest of the FEA model using a mode-superposition technique in response to a set of harmonic excitations in a range of frequencies; and
    calculating acoustic field responses at certain desired locations using an acoustic numerical procedure with nodal velocities from the velocity spectrum as boundary conditions, wherein the set of nodes directly affects the acoustic field responses for assisting user to improve the structure's design.

12. A system for performing vibro-acoustic simulation of a structure in response to harmonic excitations, said system comprising:
    a main memory for storing computer readable code for at least one application module;
    at least one processor coupled to the main memory, said at least one processor executing the computer readable code in the main memory to cause the at least one application module to perform operations by a method of:
    defining a finite element analysis (FEA) model of a structure to represent the structure's mass, damping and stiffness characteristics;
    obtaining a set of steady-state dynamic (SSD) responses in form of velocity spectrum at a set of nodes of interest of the FEA model using a mode-superposition technique in response to a set of harmonic excitations in a range of frequencies; and
    calculating acoustic field responses at certain desired locations using an acoustic numerical procedure with nodal velocities from the velocity spectrum as boundary conditions, wherein the set of nodes directly affects the acoustic field responses for assisting user to improve the structure's design.

\* \* \* \* \*